US006247078B1

(12) United States Patent
Ebert et al.

(10) Patent No.: US 6,247,078 B1
(45) Date of Patent: Jun. 12, 2001

(54) COMPUTER INTERFACE FOR INTEGRATING A FIRST COMPUTER INTO A SECOND COMPUTER

(75) Inventors: William S. Ebert, Endicott; Robert Francis Lusch, Vestal, both of NY (US); Kevin Robert Qualters, Rochester; Terry Leo Sobotta, Byron, both of MN (US); John E. Swenson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/018,665

(22) Filed: Feb. 4, 1998

Related U.S. Application Data

(63) Continuation-in-part of application No. 08/950,370, filed on Oct. 14, 1997, now Pat. No. 5,923,531.

(51) Int. Cl.[7] .............................. G06F 13/00; H05K 7/20
(52) U.S. Cl. ............................ 710/102; 361/725; 439/59
(58) Field of Search .................................. 710/101–104; 713/300; 312/223.2; 174/16.3; 165/80.3; 361/687, 688, 690, 707, 752, 695, 716, 784, 725; 439/61, 74, 59, 377

(56) References Cited

U.S. PATENT DOCUMENTS

| 5,227,957 | * | 7/1993 | Deters . |
| 5,416,427 | * | 5/1995 | Tracewell . |
| 5,499,341 | * | 3/1996 | Wilson et al. . |
| 5,533,201 | * | 7/1996 | Benton et al. . |
| 5,657,202 | * | 8/1997 | Ma . |
| 5,831,346 | * | 11/1998 | Baumann et al. . |
| 5,923,531 | * | 7/1999 | Bachman et al. . |
| 6,000,767 | * | 12/1999 | Liu et al. . |

* cited by examiner

Primary Examiner—Gopal C. Ray
(74) Attorney, Agent, or Firm—Rabin & Champagne, PC; Robert H. Berdo, Jr.

(57) ABSTRACT

An interface includes an enclosure having a plurality of walls interconnected to form a parallelepiped having a space therein. The enclosure is positionable to occupy a plurality of slots located in a computer housing of a first type computer. The enclosure has a width corresponding essentially to a total width of the plurality of slots. The interface further includes a computer subsystem of a second type computer disposed within the space of the enclosure. The computer subsystem includes a circuit card, and a distribution card attached to, and electrically coupled with, the circuit card. The distribution card is connectable to a backplane of the first type computer located external to the enclosure and within the computer housing.

28 Claims, 7 Drawing Sheets

COMPUTER INTERFACE FOR INTEGRATING A FIRST COMPUTER INTO A SECOND COMPUTER

CROSS REFERENCE TO RELATED PATENT APPLICATIONS

This application is a continuation-in-part of application Ser. No. 08/950,370, filed Oct. 14, 1997, now U.S. Pat. No. 5,923,531 entitled "ENHANCED CIRCUIT CARD ARRANGEMENT FOR A COMPUTER" by Wesley Bachman et al.

BACKGROUND OF THE INVENTION

1. Field of the Invention

The invention relates a computer interface, and in particular, to a computer interface which allows the integration of a personal computer (hereinafter also "PC") primary logic card, a PC memory riser card, and a PC peripheral component interconnect (hereinafter also "PCI") riser card into a mid-range computer, while utilizing the power supply, bus system and cooling arrangement of the mid-range computer.

2. Background Information

Computers can be purchased in a variety of sizes depending upon the computational needs of the user. For example, two common categories of computers include so-called mid-range computers, as well as personal computers. Personal computers tend to have substantially less computational power than mid-range computers, and typically include only one memory riser card, and only one processor card. Further, personal computers typically have only one power supply. As a result, personal computers generate substantially less heat than mid-range computers, so that cooling requirements for the personal computer are generally easier to implement.

Further, because personal computers contain fewer components than mid-range computers, their housings are typically substantially smaller than the corresponding housings used for mid-range computers. As such, personal computers can be readily placed on a user's desk, while mid-range computers generally can not.

Moreover, personal computers are typically priced in a range that makes then readily affordable by the general population. As a result, it is likely that there are substantially more personal computers in use than there are mid-range computers. Further, due to the popularity of personal computers, there are many program applications (i.e., software) available for use with personal computers, which can be purchased at relatively low prices, and at a variety of locations.

Mid-range computers are typically characterized as being relatively powerful, and have a relatively high computational speed, as compared to personal computers. Examples of such computers include the IBM® AS/400e Series™ manufactured by International Business Machines Corporation of Armonk, N.Y. These computers are typically used when a user has a need for greater computational power, such as when the computer is used as a communications or network server, or when the computer is being used for specialized tasks that require a high computational speed or processing power.

Typically, mid-range computers can accommodate a plurality of memory riser cards, and a plurality of processor cards. Thus, the mid-range computer's memory and computational speed can be adapted to the specific needs of the user, by providing more or less cards as required.

Further, each memory riser card can typically accommodate a large number of memory modules, e.g. removable dual in-line memory modules (hereinafter also DIMMs). The DIMMs can be inserted into electrical slots provided on the surface of the card. Typically, the memory riser cards are provided in a commercial system with some empty electrical slots, which can receive additional DIMMs as the computer memory needs of the user increase. For example, a typical memory riser card can be adapted to accommodate up to sixteen DIMMs.

A further characteristic of a mid-range computer is that it typically contains several power supplies, which include back-up or redundant power supplies. Thus, should one power supply fail, a back-up power supply can be immediately utilized to prevent a shut down of the computer system, and a resulting loss of data. As a result of these additional power supplies, as well as the increased number of memory riser cards and processor cards, and the increased size of the cards and circuits thereon, mid-range computers typically generate substantial heat, which if not dissipated, could cause the fragile components of the computer to fail, or operate at a non-optimal level. As such, mid-range computers are typically provided with a specifically tailored cooling system which causes a cooling gas, such as air, to flow through the system in a predetermined manner, to dissipate excess heat therefrom.

A further characteristic of mid-range computers are their relatively large size, which is a result of the large number of components housed therein. As such, the mid-range computer typically has a large footprint, which prevents the mid-range computer from being conveniently placed on a user's desk. As a result, mid-range computers are typically located on the floor.

Yet another characteristic of the mid-range computer is its relatively high purchase price. Due to this, the number of mid-range computers on the market may be substantially less than the number of personal computers on the market, since the cost of a mid-range computer is beyond the purchasing ability of the general population.

Since there are probably fewer mid-range computers on the market, as compared to personal computers, fewer application programs are purchased for mid-range computers. As a result, the number of program applications available for use with the mid-range computer is somewhat limited as compared with those available for PCs, and the programs which are available are relatively expensive, due to the lack of demand for such programs. Therefore, a need exists for a way to utilize the software applications tailored for a personal computer within a mid-range computer system.

Prior solutions for combining PC capability into a mid-range computer included connecting the larger host computer (the mid-range computer) to a stand-alone PC-type computer using an interface cable, for example. However, this solution has several disadvantages. For example, by using two computers cabled together, the total space needed for the computers is considerable, since each system individually uses a substantial amount of space. Therefore, a need exists for a computer system that has the processing and computational power of a mid-range computer, that can operate PC program applications, without increasing the overall size of the computer system beyond that of a conventional mid-range computer.

Furthermore, since the known solution requires that two complete computer systems be purchased, with resulting redundancies, the total overall cost is significant. Thus, a need exists for a computer system that has the power of a mid-range computer, but that has the flexibility to run PC program applications, without significantly increasing the cost of the computer.

Additionally, since with the known solution two complete computer systems must be maintained, and since each system has its own set of discrete components, there are more components available that are subject to failure. Therefore, a need exists for a mid-range computer that can utilize PC software applications without decreasing the reliability of the system.

Additionally, it is known to integrate two different computer platforms into the same computer housing. For example, certain desktop Apple™ computers (PowerMacs™) have PC hardware incorporated therein. As such, the resulting computer system can utilize PC designed software, as well as software designed for Apple™ computers. However, this arrangement does not recognize the need for integrating PC hardware into a mid-range computer. Further, the PC subsystem in this arrangement is limited in its processing ability, due to the limited space available for PC hardware components within the Apple™ computer. Thus, a need exists for a mid-range computer having a PC subsystem incorporated therein, with the PC subsystem having the flexibility and processing ability of a stand-alone personal computer.

SUMMARY OF THE INVENTION

It is, therefore, a principle object of this invention to provide a computer interface.

It is another object of the invention to provide a computer interface that solves the above mentioned problems.

These and other objects of the present invention are accomplished by the computer interface disclosed herein.

Advantageously, according to one aspect of the present invention, the interface includes a hollow, generally parallelepiped-shaped enclosure, although other shaped enclosures are within the scope of the present invention. The enclosure includes a base cover and a top cover. Preferably, the covers are metal, so as to provide a sturdy structure to which PC hardware components may be attached. Further, such covers help to distribute installation and extraction forces which may be generated thereon, due to the installation and removal of various PC circuit cards, as well as the installation and removal of the interface into the mid-range computer. However, the present invention is not limited to metal covers. Instead, the covers may be made of any material, such as a rigid plastic, as long as the resulting enclosure is rigid and strong.

Preferably, the enclosure includes an upper guide rail and a lower guide rail to which the covers are attachable. According to one aspect of the present invention, one end of each guide rail is pivotally attached to the covers. This arrangement advantageously allows the guide rails to be pivoted to an open position to allow easy access to the interior space of the enclosure.

According to a further aspect of the present invention, the guide rails are preferably provided with a plurality of perforations so as to allow a cooling gas to pass through the space within the enclosure, to dissipate any heat generated by the components therein. This allows the cooling system of the mid-range computer to be utilized to cool the components located within the enclosure.

According to a further aspect of the present invention, the enclosure is locatable within a mid-range computer by positioning the enclosure in available (i.e., empty) input/output (hereinafter, also I/O) slots within the housing of the mid-range computer. The guide rails advantageously engage with corresponding guides formed in the housing of the mid-range computer so as to easily locate and guide the enclosure to its desired position. This advantageously allows the enclosure to be installed in a mid-range computer in a simple manner.

Preferably, both the upper and the lower guide rail have a latch member attached to an end thereof, which engages with a corresponding latch member formed on the housing of the mid-range computer. The latch members advantageously hold the enclosure in its desired location after it has been properly positioned.

According to yet a further aspect of the present invention, the enclosure further includes a tailstock. The tailstock is preferably comprised of a metal material so as to form an EMC (electromagnetic compatible) shield, i.e., a shield which allows operation in an electromagnetic environment at an optimal level of efficiency, and which allows for static charges to be drained to a frame ground.

Preferably, the enclosure is sized so as to house select components of a PC therein (i.e., a PC subsystem). Further, the overall width of the enclosure is advantageously tailored so as to occupy and utilize a plurality of slots of the I/O subsystem of the mid-range computer. This allows the aforementioned guides and latch members of the mid-range computer, which are tailored to guide and retain mid-range type I/O cards, to be utilized in a similar manner for the enclosure.

According to a further aspect of the present invention, the enclosure contains various PC components therein, which collectively form a PC subsystem. For example, a primary logic card may be locatable within the enclosure. The primary logic card may have a processor module connected thereto, and may be provided with a fan sink arranged on top of the processor module. The fan sink advantageously supplements the cooling system of the mid-range computer to help dissipate the heat generated by the components of the PC subsystem. Of course, other placements of the fan sink are within the scope of the invention.

Advantageously, according to a further aspect of the invention, the primary logic card may include one or more card slots for receiving circuit cards, such as a PCI (peripheral component interconnect) riser card and a memory riser card. Due to the added width of the enclosure, as described above, the riser cards can be plugged into the card slots of the primary logic card so as to project, for example, at a right angle away from the surface thereof. By providing pluggable riser cards, more components and circuitizable area is made available compared to a single conventional circuit card accommodated by the I/O subsystem.

In one aspect of the invention, the memory riser card includes a plurality of slots for receiving dual in-line memory modules (DIMMs). By providing multiple dual in-line memory module slots, the memory of the PC subsystem can be easily changed by adding and/or replacing dual in-line memory modules from the base memory configuration.

In a further aspect of the invention, in order to securely hold the memory riser card in position, its tailstock is engageable with the top cover. For example, the top cover may press against the tailstock to urge the memory riser card into its corresponding slot. This arrangement advantageously prevents the memory riser card from moving in a linear direction, and out of its slot. Alternatively, or in addition to, the top cover can be provided with a plurality of protrusions arranged to project past both sides of the tailstock, thus reducing any rotational motion of the memory riser card about its slot, i.e., lateral swaying of the memory riser card. Other arrangements for minimizing motion of the memory riser card within its associated slot, are likewise within the scope of the invention. By minimizing motion of the memory riser card in its slot, fretting of the connector contacts between the memory riser card and the primary logic card is reduced. As is known, fretting is a phenomenon in which surface damage occurs when metal contacts are subjected to microvibrations.

In a further aspect of the invention, the PCI riser card is adapted to accommodate a plurality of PCI cards. For example, the PCI riser card can accommodate up to three PCI cards, although it may be adapted to accommodate a different number of cards, without departing from the scope of the invention. This arrangement allows the user the flexibility to configure the computer as needed.

According to a further aspect of the invention, the PCI riser card can be easily accessed by pivoting the upper guide rail in the aforementioned manner to expose the PCI cards and/or the slots that accommodate the PCI cards. This allows PCI cards to be inserted and/or removed from the associated slots in an easy manner.

In yet a further aspect of the present invention, a stiffener is attached to a back side of the PCI riser card. The stiffener is connected to, and extends between, the top cover and the primary logic card. The stiffener advantageously provides added stiffness to the PCI riser card, so that the PCI cards can be inserted into the slots on the PCI riser card, without twisting the PCI riser card in its slot on the primary logic card.

According to a further aspect of the invention, the stiffener can include a recess which accommodates the PCI riser card. This arrangement helps maintain the connection between the primary logic card and the PCI riser card, thus preventing fretting of the contacts therebetween.

According to another aspect of the invention, the interface preferably includes a distribution card located within the enclosure. The distribution card is connected to the primary logic card, and passes power between the mid-range computer and the PC subsystem. This advantageously allows the PC subsystem to utilize the power system of the mid-range computer.

In a further aspect of the invention, the distribution card is provided with a plurality of connectors, which connect with corresponding backplane connectors on the host computer. Each connector is provided with one or more electrical terminals, in a known manner. Further, the distribution card is sized to extend across the slots of the mid-range computer when the enclosure is properly positioned therein, so that each connector of the distribution card is in registration with a corresponding backplane connector. When the respective connectors of the distribution card and the backplane engage each other, the terminals of the distribution card connectors will contact power terminals located within the respective backplane connectors. Since the PC device may consume significantly more power than the typical I/O card which would conventionally be inserted into the slots of the mid-range computer, the arrangement advantageously supplies sufficient power to the PC subsystem by utilizing a number of slots, and an associated number of power terminals.

Preferably, the distribution card includes a power regulator which advantageously establishes the appropriate levels and amounts of power required for the various components of the PC subsystem.

Thus, the distribution card allows the power system existing on the mid-range computer to be utilized, by managing power distribution and voltage losses at levels that ensure the effective operation of the PC subsystem.

According to a further aspect of the invention, a region of the distribution card in an area of its connectors is preferably sandwiched between a wall of the enclosure and a stiffener panel. The stiffener panel helps to absorb and distribute forces which may be generated when the connectors of the distribution card are plugged into the corresponding connectors of the mid-range computer.

In further aspect of the invention, a flexible printed circuit connects the PC subsystem with the mid-range computer, so that logical data can be shared therebetween. One end of the flexible printed circuit cable is preferably connected directly to one of the distribution card connectors, while the other end plugs into the primary logic card. This arrangement allows the lengths of the data and address buses to be minimized, which helps to maintain data integrity and optimizes bus performance.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
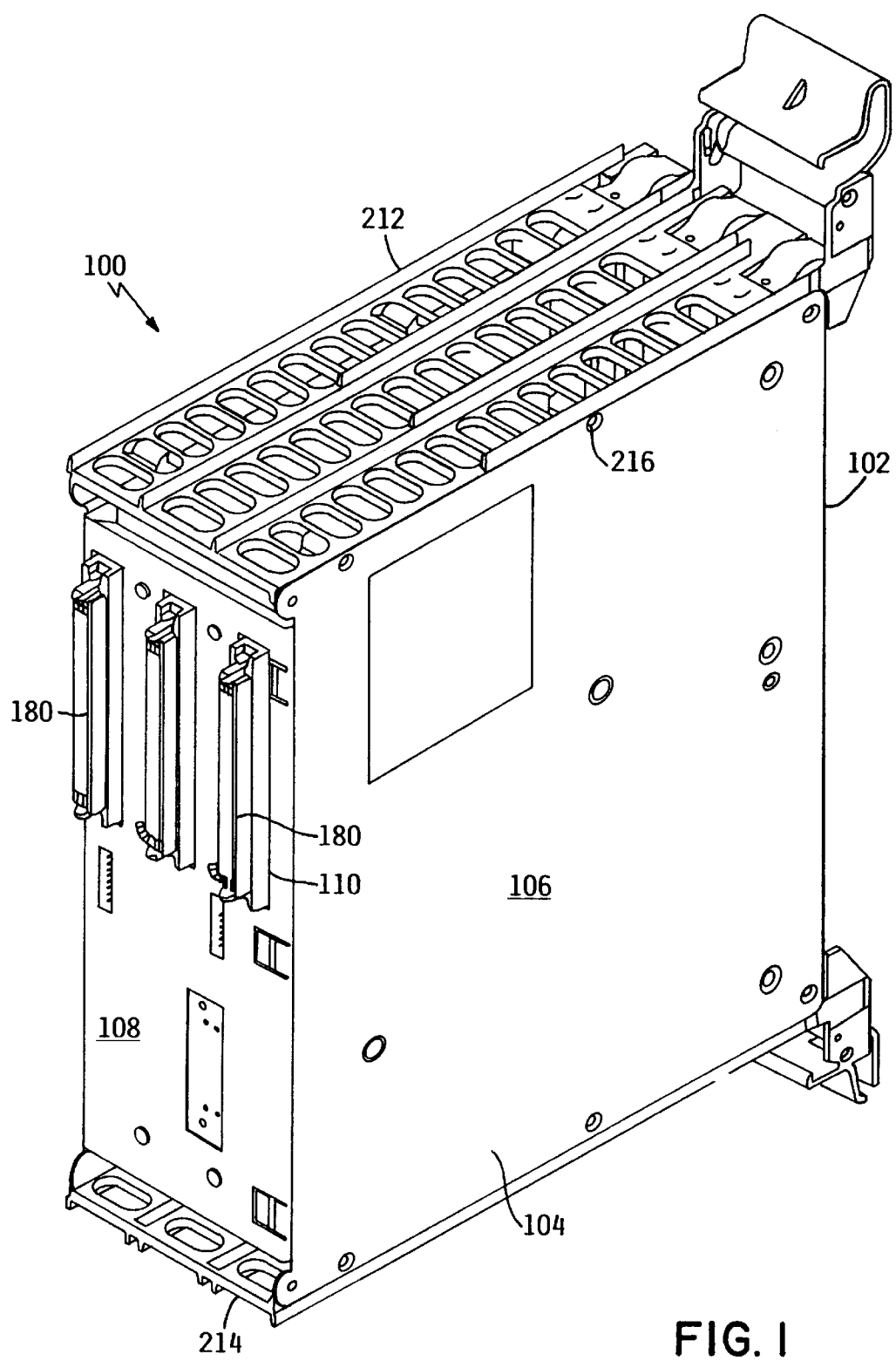
FIG. 1 is a perspective illustration of an exemplary embodiment of an interface, according to the present invention.
Figure 2:
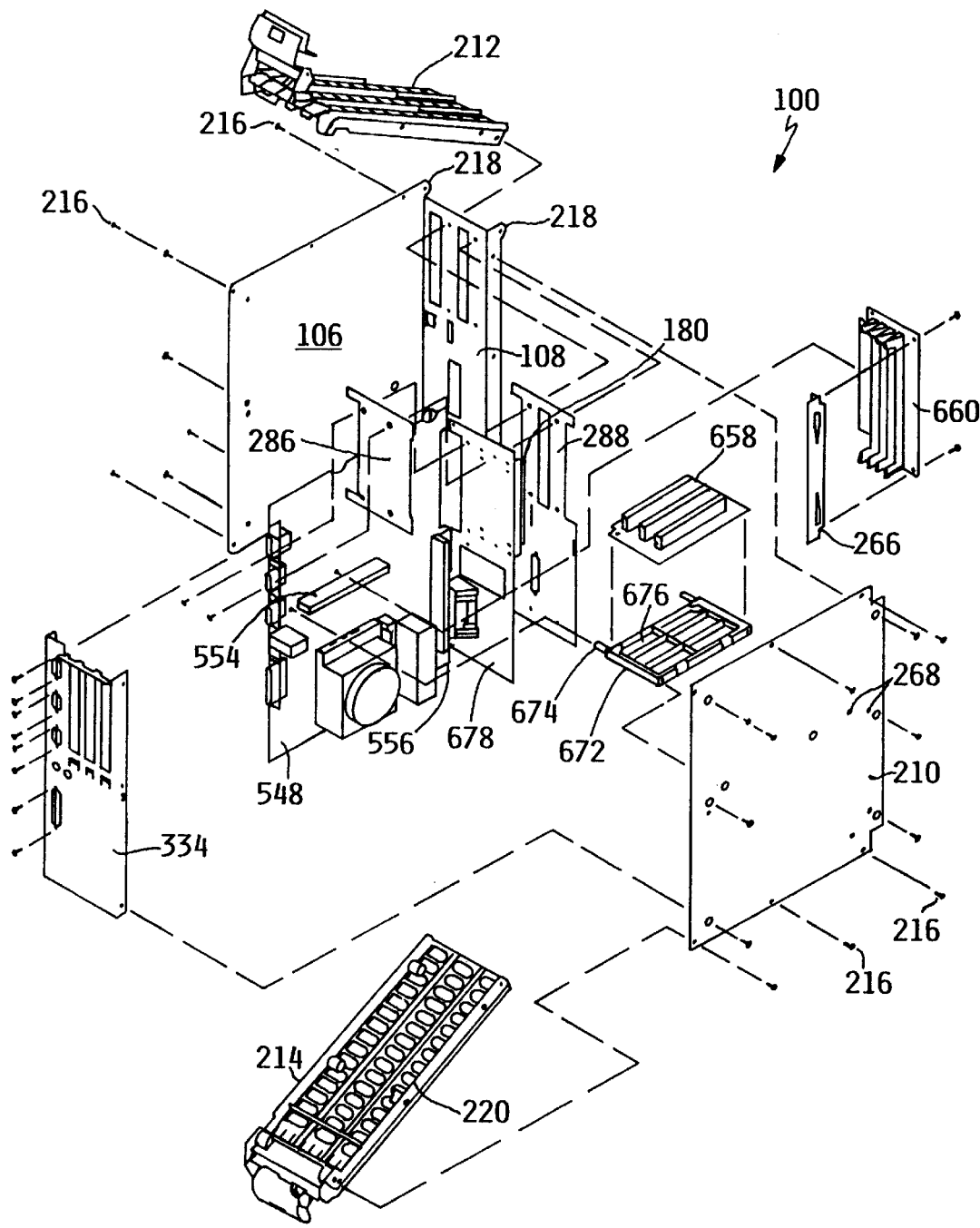
FIG. 2 is an exploded illustration of the interface shown in FIG. 1, showing its illustrated PC subsystem and enclosure.

FIG. 1 illustrates an exemplary embodiment of the invention, showing a perspective view of an interface assembly 100 for integrating personal computer hardware into a mid-range computer. FIG. 2 illustrates the interface assembly 100 in an exploded condition. Although the following description, by way of example, is directed toward integrating a personal computer into a mid-range computer, the inventive concepts can be applied to integrate any type of computer platform (i.e., a first type computer) into a different computer platform (i.e., a second type computer).

As shown, the interface assembly 100 includes a hollow, generally parallelepiped-shaped enclosure (housing) 102 (i.e., a so-called "book"), although other enclosure shapes are within the scope of the invention. The enclosure 102 includes a base cover 104 having one generally flat major wall surface 106, and a formed minor wall surface 108 contiguous to the major wall surface 106 and arranged at a right angle thereto. The major wall surface 106 and the minor wall surface 108 form a generally L-shaped structure. The minor wall surface 108 has one or more apertures 110 formed therein to allow for components disposed within the enclosure 102 to be connected to various components of the mid-range computer, as will be described in detail in the paragraphs to follow.

As best shown in FIG. 2, the enclosure 102 further includes a top cover 210 that is spaced away from the major wall surface 106 and is essentially parallel thereto. One edge of the top cover 210 is connectable to an edge of the minor wall surface 108 using, for example, screws 216, so that the resulting base cover 104 and top cover 210 form an essentially U-shaped structure.

The base cover 104 and the top cover 210 are preferably comprised of metal, although other materials may be used within the scope of the invention. However, by being metal, the covers will form an EMC (electromagnetic compatible) shield, i.e., a shield which allows operation in an electromagnetic environment at an optimal level of efficiency, and which allows for static charges to be drained to a frame ground, i.e., either through direct contact between the covers and the frame, or via adjacently located circuit cards. The covers 104, 210 provide a sturdy structure to which PC hardware components can be attached. Further, the covers 104, 210 help to distribute installation and extraction forces which may be generated thereon, due to the installation and removal of various PC circuit cards, as well as the installation and removal of the interface assembly 100 into the mid-range computer, as will described in the paragraphs that follow.

The enclosure 102 further includes an upper guide rail 212 and a lower guide rail 214. The upper guide rail 212 is attachable to upper edges of the major wall surface 106 and the top cover 210, using, for example, screws 216. Further, the lower guide rail 214 is attachable to lower edges of the major wall surface 106 and the top cover 210 in a similar manner.

Preferably, one end of each guide rail 212, 214 is pivotally attached to respective projecting flanges 218 disposed on opposite longitudinal edges of the minor wall surface 108. This arrangement allows the guide rails 212, 214 to be pivoted to an open position when the associated fasteners, such as the screws 216, are removed. When pivoted to the open position, the interior space of the enclosure 102 becomes accessible.

The upper and lower guide rails 212, 214 are arranged to be essentially parallel to each other (when in their closed position), and have a width that is about equal to a width of the minor wall surface 108, and a length which is about equal to the length of the major wall surface 106 and the top cover 210. Both the upper guide rail 212 and the lower guide rail 214 are preferably molded from a plastic. Further, the guide rails 212, 214 are preferably provided with a plurality of perforations 220 so as to allow a cooling gas to pass through the space within the enclosure 102, to dissipate any heat generated by the components therein.

Figure 3:
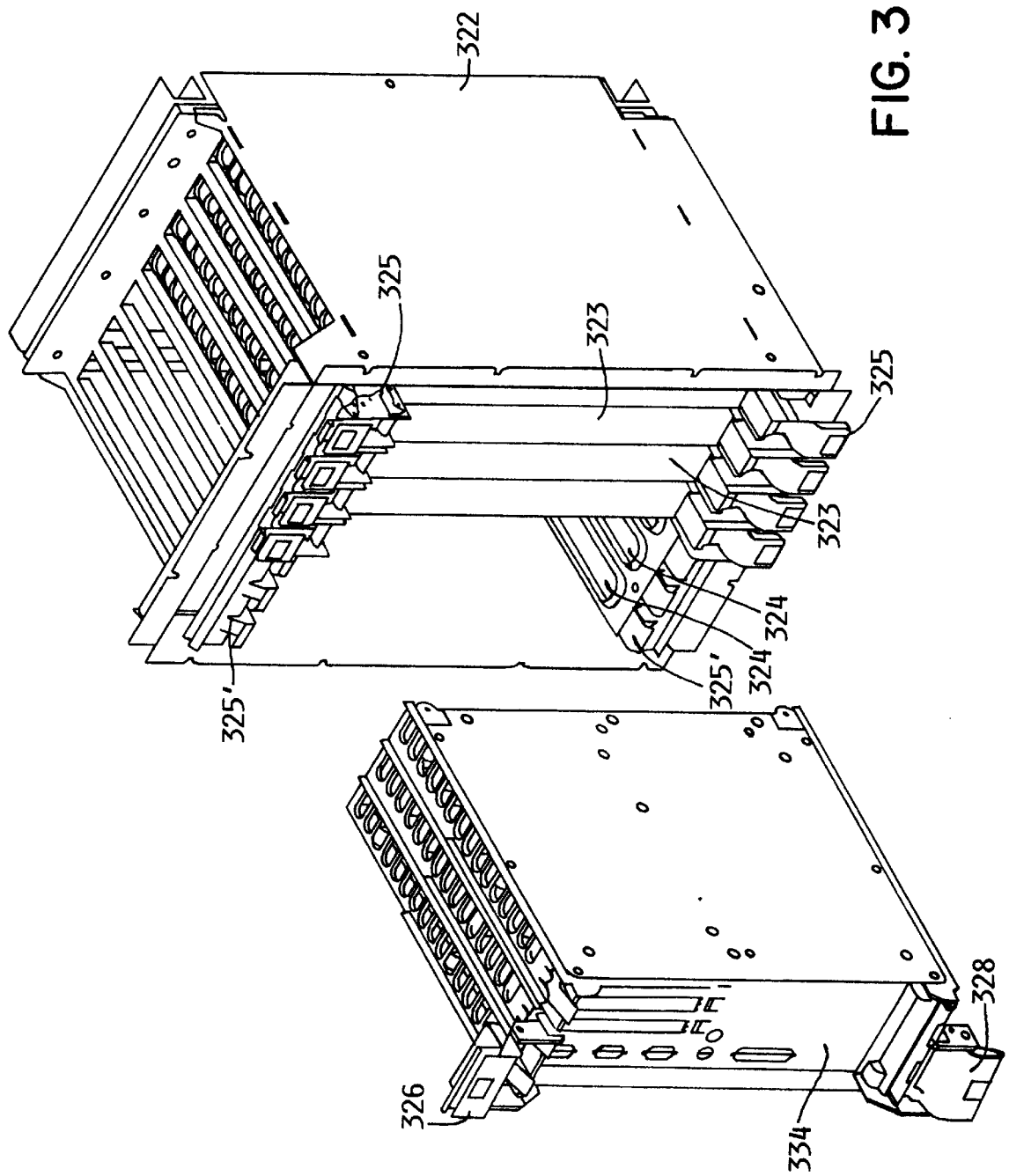
FIG. 3 is a perspective illustration of the interface shown in FIG. 1, prior to insertion into a housing of a mid-range computer.

Referring briefly to FIG. 3, the interface assembly 100 is adapted to be positionable within an electronics housing 322 of the mid-range computer. Housing 322 has a plurality of slots located therein which are each adapted to receive, for example, an electronics card 323, for example, an I/O card.

In particular, a guide 324 is provided at the top and bottom of each slot, which engages with corresponding rails (not shown) of each respective card 323, so as to guide and position the cards 323 within the housing 322. Once the card 323 is in position, a latch member 325 of the card 323 will engage with a corresponding latch member 325' formed on the housing 322, to hold the card 323 in position.

A backplane (not shown) is conventionally located at one end of the housing 322, at the end of the respective slots. The backplane will conventionally be provided with a plurality of backplane I/O slot connectors (i.e., female connectors, not shown), with each backplane connector being in registration with a respective slot. Further, each card 323 will typically be provided with a male connector (not shown) that engages with a corresponding backplane connector, so that terminals of each respective backplane connector are electrically coupled with terminals of each respective card connector, in a known manner. Power is thus supplied to each card 323 from a power supply (not shown) of the mid-range computer via the aforementioned connectors.

To install the enclosure 102 into a mid-range computer, the enclosure 102 is positioned in available (i.e., empty) slots within the housing 322. The guide rails 212, 214 engage with the corresponding guides 324 formed in the housing 322 of the mid-range computer so as to properly locate and guide the enclosure 102 to its desired position. This advantageously allows the enclosure 102 to be installed in a mid-range computer in a simple manner.

The overall width of the enclosure 102 is tailored so as to occupy and utilize a plurality of slots of the I/O subsystem of the mid-range computer. For example, in the embodiment shown in FIG. 3, the enclosure 102 occupies three slots. However, the enclosure 102 can likewise be adapted to occupy only two slots, or more than three slots.

Furthermore, both the upper and the lower guide rail 212, 214 have a latch member 326, 328 attached to an end thereof (i.e., at an end opposite to the minor wall surface 108), which engage with corresponding latch members 325' formed on the housing 322 of the mid-range computer. The latch members 325', 326, 328 hold the enclosure 102 in its desired location after it has been properly positioned.

The enclosure 102 further includes a tailstock 334 which is arranged, for example, essentially parallel to the minor wall surface 108. The tailstock 334 is preferably comprised of a metal material so as to form an EMC (electromagnetic compatible) shield, and which allows for static charges to be drained to a frame ground via the covers 104, 210. However, the tailstock can also be made of other materials within the scope of the invention.

Figure 4:
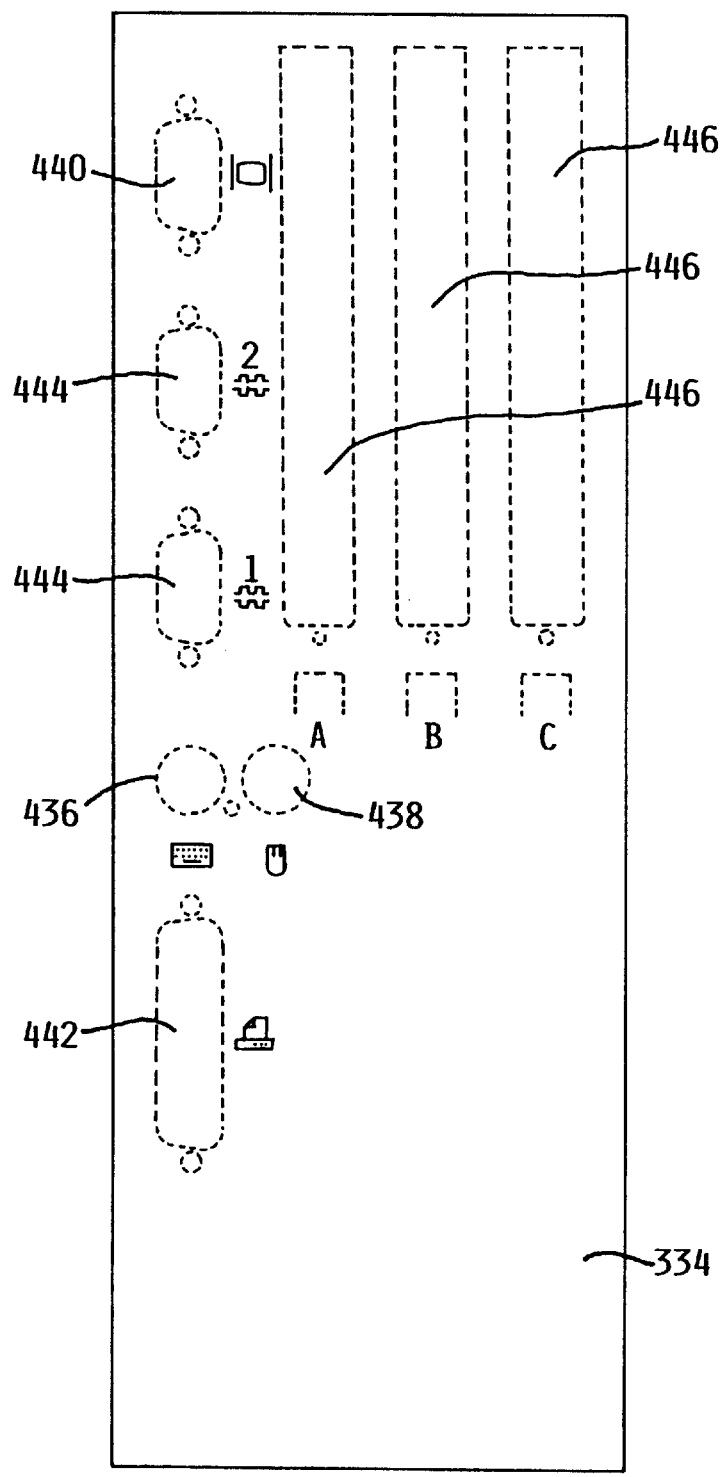
FIG. 4 is an elevational view of a tailstock of the enclosure shown in FIG. 2.

As best shown in FIG. 4, the tailstock 334 is provided with a plurality of apertures, which form various external ports which allow various external peripherals to be connected to the PC components located within the enclosure 102. For example, the tailstock 334 can be provided with a keyboard port 436, a mouse port 438, a monitor port 440, a parallel port 442, serial ports 444 (two are illustrated) and input/output (I/O) ports 446 (three are illustrated).

The above-mentioned enclosure components, i.e., the base cover 104, top cover 210, upper and lower guide rails 212, 214 and tailstock 334 collectively form the walls of the enclosure 102. The resulting structure is sized so as to house select components of a PC therein.

A computer subsystem is contained within the enclosure 102, which includes various PC components, which collectively form a PC subsystem. For example, and referring to FIG. 5, a primary logic card 548 is locatable within the enclosure 102 and arranged, for example, adjacent to the major wall surface 106 of the base cover 104. However, the primary logic card 548 can be positioned in other locations without departing from the scope of the invention. The primary logic card 548 has a processor module 550 connected thereto, and includes a fan sink 552 arranged on top of the processor module, although other locations of the fan sink are within the scope of the invention. The fan sink 552 supplements the cooling system of the mid-range computer to help dissipate the heat generated by the components of the PC subsystem.

Figure 6:
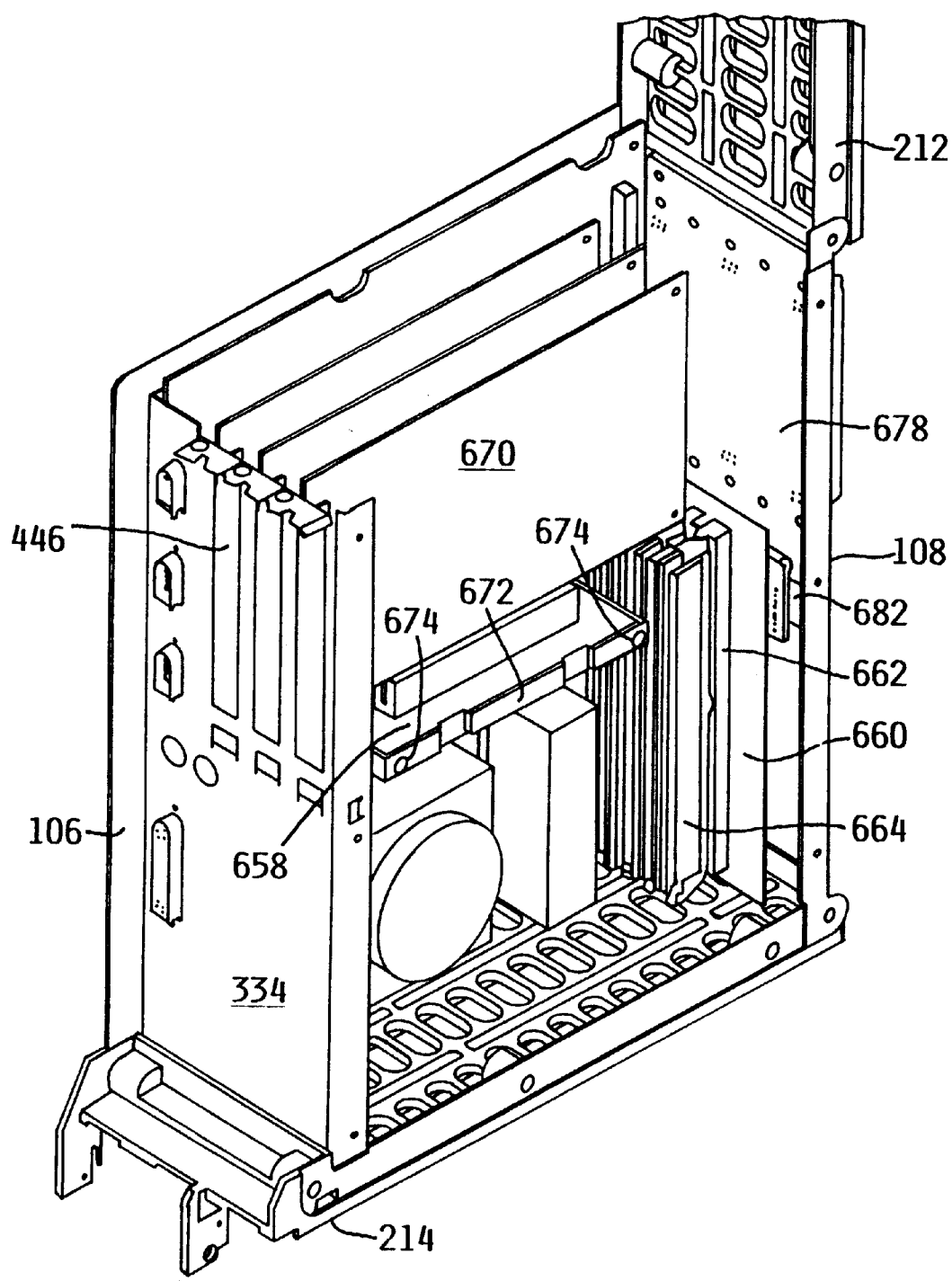
FIG. 6 is a perspective illustration of the enclosure and PC subsystem shown in FIG. 2, with a cover of the enclosure removed.

Furthermore, the primary logic card 548 includes several card slots 554, 556 for receiving circuit cards, such as a PC) (peripheral component interconnect) riser card 658 and a memory riser card 660, as shown in FIG. 6. Due to the added width of the enclosure 102, the riser cards 658, 660 can be plugged into the card slots 554, 556 of the primary logic card 548 so as to project, for example, at a right angle away from the surface thereof. By providing pluggable riser cards, more components and circuitizable area is made available compared to a single conventional circuit card accommodated by the I/O subsystem.

In this exemplary embodiment, the memory riser card 660 is arranged to be essentially parallel and adjacent to the minor wall surface 108 of the base cover 104, although other arrangements of the memory riser card 660 are within the scope of the invention. The memory riser card 660 includes, for example, four slots 662 for receiving dual in-line memory modules 664 DIMMs), although it may be provided with more or fewer slots, without departing from the scope of the invention. By providing multiple dual in-line memory module slots 662, the memory of the PC subsystem can be easily changed by adding and/or replacing dual in-line memory modules 664 from the base memory configuration. To perform this task, the top cover 210 is removed from the enclosure 102 so that the memory riser card 660 can be grasped by its tailstock 266 (see FIG. 2). The memory riser card 660 can then be easily unplugged from the primary logic card 548 so that the dual inline memory modules 664 can be added and/or removed therefrom. After the memory upgrade has been completed, the device is reassembled in a reverse order.

In order to securely hold the memory riser card 660 in position, the tailstock 266 of the memory riser card 660 is engageable with the top cover 210. For example, the top cover 210 can press against the tailstock 266 to urge the memory riser card 660 into its corresponding slot 556. This arrangement will prevent the memory riser card 660 from moving in a linear direction, and out of its slot 556. Alternatively, or in addition to, the top cover 210 can be provided with a plurality of protrusions (not illustrated) arranged to project past both sides of the tailstock 266, thus reducing any rotational motion of the memory riser card 660 about its slot 556, i.e., lateral swaying of the memory riser card 660. The projections can be formed by forming tabs 268 in the top cover 210, as shown in FIG. 2, and then bending the tabs inwardly toward the tailstock 266. Other arrangements for minimizing motion of the memory riser card 660 within its associated slot 556, are likewise within the scope of the invention. By minimizing motion of the memory riser card 660 in its slot 556, fretting of the connector contacts (not shown) between the memory riser card 660 and primary logic card 548 is reduced. As is known, fretting is a phenomenon in which surface damage occurs when metal contacts are subjected to microvibrations.

Likewise, and as shown in FIG. 6, the PCI riser card 658 is insertable within the corresponding slot 554 located in the primary logic card 548. When inserted, the PCI riser card 658 is essentially perpendicular to the major wall surface 106 of the base cover 104, and parallel to the upper and lower guide rails 212, 214, although other arrangements of the PC riser card 658 are within the scope of the invention.

Preferably, the PCI riser card 658 is adapted to accommodate a plurality of circuit cards, such as PCI cards 670. For example, in the exemplary illustrated embodiment, the PCI riser card 658 can accommodate up to three PCI cards 670, although it may be adapted to accommodate a different number of cards, without departing from the scope of the invention. This arrangement allows the user the flexibility to configure the computer as needed.

The PCI cards 670 can include communication cards, such as LAN (local area network), WAN (wide area network) and/or ATM (asynchronous transfer mode) cards, which are provided with terminals that can be connected to hardware located external to the enclosure 102. However, the PCI cards can be of any type that complies with industry standards, such as a fax/modem card, for example. Further, and as shown, when the PCI cards 670 are installed, their respective terminals are in registration with corresponding input/output ports 446 located in tailstock 334, so that the terminals are readily available for connection to other hardware components.

In order to access the PCI riser card 658, the upper guide rail 212 is pivoted in the aforementioned manner to expose the PCI cards 670 and/or the slots that accommodate the PCI cards. This allows PCI cards 670 to be inserted and/or removed from the associated slots in an easy manner. Preferably, a stiffener 672, comprised of plastic, for example, is attached to a back side of the PCI riser card 658. The stiffener 672 includes four tapered pins 674, two of which fit into corresponding holes formed in the top cover 210, and two of which fit into corresponding holes located in the primary logic card 548 (only the two pins which fit into the top cover 210 are illustrated in this view; all four pins are viewable in FIG. 2). The stiffener 672 provides added stiffness to the PCI riser card 658, so that the PCI cards 670 can be inserted or removed into the slots on the PCI riser card 658, without twisting the PCI riser card 658 in its slot on the primary logic card 548.

Further, the stiffener 672 can include a recess 676 which accommodates the PCI riser card 658. In FIG. 6, the recess 676 is shown as being occupied by the PCI riser card 658. FIG. 2 illustrates the recess 676 without the PCI riser card 658 therein. This arrangement helps maintain the connection between the primary logic card 548 and the PCI riser card 658, thus preventing fretting of the contacts therebetween.

Preferably, the interface assembly 100 includes a distribution card 678 located within the enclosure 102. The distribution card 678 is arranged, for example, at an edge of the primary logic card 548, and is connected thereto. For example, the distribution card 678 can be permanently connected, i.e. hard-wired, to the primary logic card 548, or can include a connection that plugs into a corresponding connector located on the primary logic card 548 in a removable manner.

The distribution card 678 passes power between the mid-range computer and the PC subsystem. This allows the PC subsystem to utilize the power system (not shown) of the mid-range computer. To receive this power, the distribution card 678 is provided with a plurality of connectors 180 (see FIG. 1), for example, three connectors, which connect with corresponding backplane connectors (not shown) on the host computer, in a manner similar to the connection between the cards 323 and the backplane, as described above. Each connector 180 is provided with one or more electrical terminals (not shown), in a known manner.

The distribution card 678 is sized to extend across the slots of housing 322 when the enclosure 102 is properly positioned therein, so that each connector 180 of the distribution card 678 is in registration with a corresponding backplane connector. When the respective connectors of the distribution card 678 and the backplane engage each other, the terminals of the connectors 180 on the distribution card 678 will likewise contact power terminals located within the respective backplane connectors. Since the PC device may consume significantly more power than the typical card 323 which would conventionally be inserted into the slots of the mid-range computer, sufficient power can be supplied to the PC subsystem by utilizing a number of slots, and an associated number of power terminals.

The distribution card 678 further includes a power regulator 682 which establishes, in a conventional manner, the appropriate levels and amounts of power required for the various components of the PC subsystem. Further, a power connector 584 (FIG. 5) is provided which connects, for example, by plugging, the distribution card 678 to the primary logic card 548.

The aforementioned distribution card 678 allows the power system existing on the mid-range computer to be utilized, by managing power distribution and voltage losses at levels that ensure the effective operation of the PC subsystem.

As will be appreciated, significant forces may be needed in order to plug the three connectors 180 of the distribution card 678 into the corresponding connectors of the backplane of the mid-range computer. To accommodate these forces, and to prevent breakage of the distribution card 678, a region of the distribution card 678 in an area of its connectors 180 is preferably sandwiched between the minor wall surface 108 of the enclosure 102 and a plastic stiffener panel 286, as best shown in FIG. 2. The stiffener panel 286 is fastened to the minor wall surface 108 using, for example, screws which pass through the distribution card 678.

Further, in order to ensure that the distribution card 678 does not electrically contact the metal minor wall surface 108, the distribution card 678 is separated from the minor wall surface 108 using an insulator panel 288, as best shown in FIG. 2. When the insulator panel 288, the distribution card 678, the plastic stiffener panel 286, and the minor wall surface 108 are all connected, for example, using screws, the resulting structure has sufficient rigidity to allow the connectors 180 on the distribution card 678 to be simultaneously connected to the corresponding connectors on the mid-range computer.

Figure 5:
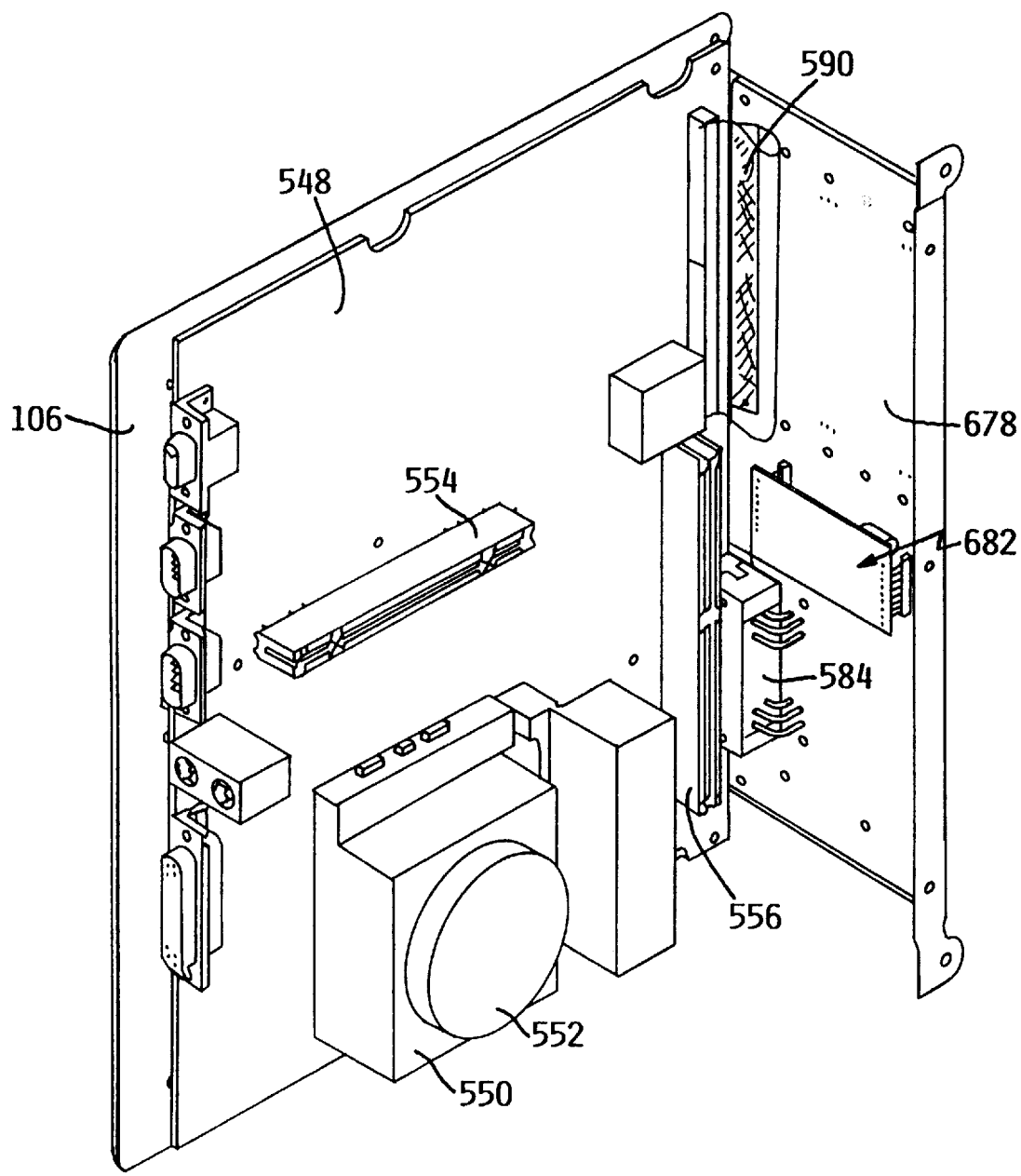
FIG. 5 is a perspective illustration of various ones of the components of the PC subsystem shown in FIG. 2.

As shown best in FIG. 5, a flexible printed circuit 590 connects the PC subsystem with the mid-range computer, so that logical data can be shared therebetween. One end of the flexible printed circuit cable 590 is connected directly to one of the distribution card connectors 180, while the other end plugs into the primary logic card 548. This arrangement allows the lengths of the data and address buses to be minimized, which helps to maintain data integrity and optimizes bus performance.

Figure 7:
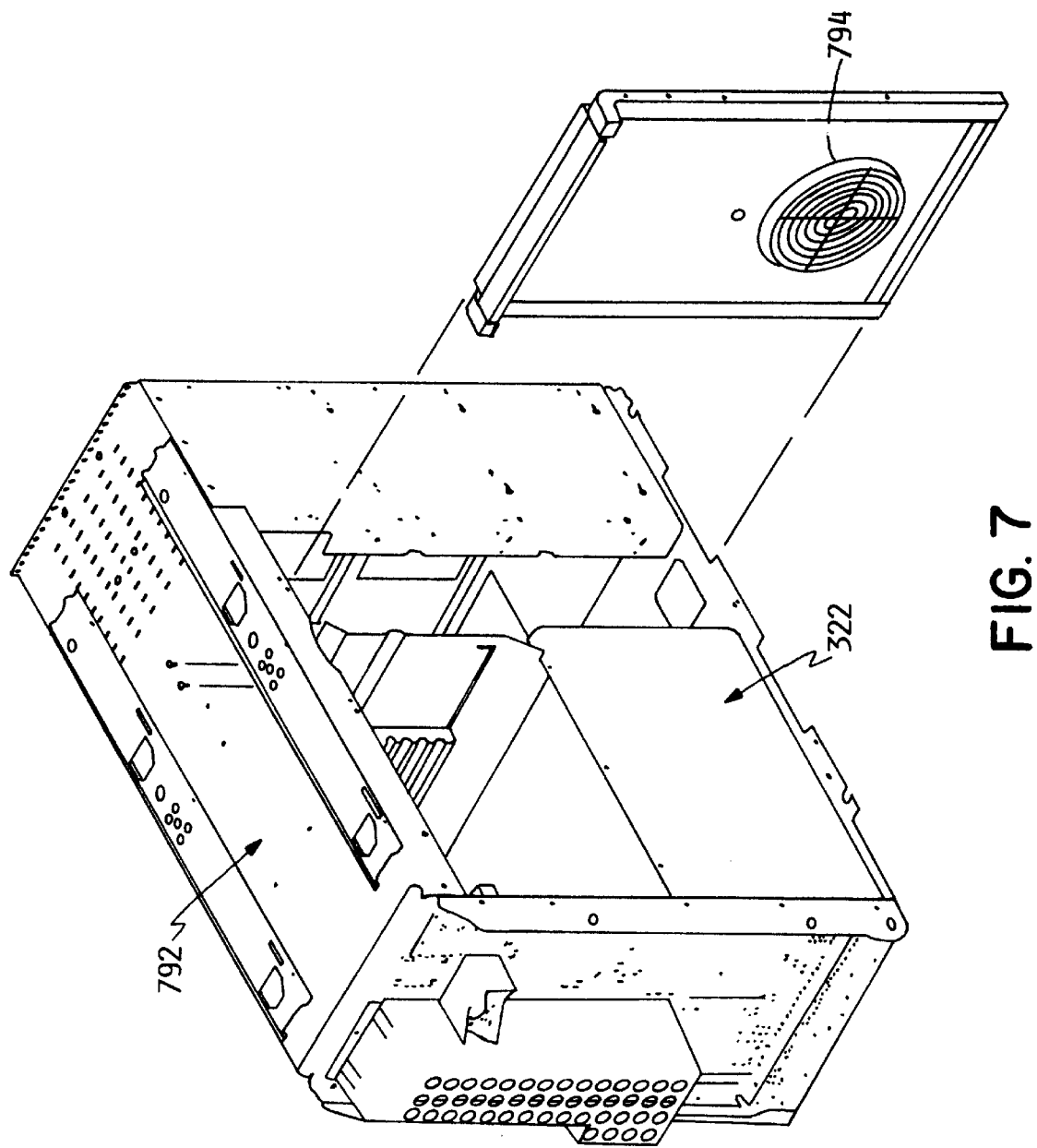
FIG. 7 is a perspective illustration of the present invention arranged within a mid-range computer housing.

Referring now to FIG. 7, during operation, the cooling subsystem of the mid-range computer acts as the primary means for cooling the PC subsystem. For example, the housing 322 of the mid-range computer, which contains the interface assembly 100, can be positioned within a larger housing 792. A fan 794 may be provided, which directs a cooling flow of air through the housing 322, so as to dissipate any heat generated by components therein. Air which would normally flow through the slots that the enclosure 102 is occupying, will pass through the perforations 220 located in the guide rails 212, 214 to dissipate heat generated by the various components of the PC subsystem. As mentioned earlier, additional cooling air may be provided by utilizing fan sink 552, which attaches to the top of the processor module 550 and which would provide impingement cooling to the processor module. This arrangement provides for a cooling system that creates no shadowing or thermal wakes for the air flow in either air flow direction (i.e., in through the bottom guide rail 214 and out through the top guide rail 212 or vice versa).

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. For example, the inventive concept can be applied using various types of electronic component cards having edge connectors for mating with slot connectors on computer system motherboards and backplanes. For example, a number of standard types are currently in use, which may be applied with the present invention. These standard types include ISA (Industry Standard Architecture —8/16 bits) and EISA (Expanded ISA —32 bits), SCSI (Small Computer System Interconnect), PCI (Peripheral Component Interconnect), MCA (Micro Channel Architecture), VLB (VESA Local Bus), AGP (Accelerated Graphics Port), and USB (Universal System Bus), to name just a few.

It will be understood that the above description of the preferred embodiments of the present invention are susceptible to various modifications, changes, and adaptations, and the same are intended to be comprehended within the meaning and range of equivalents of the appended claims.

What is claimed is:

1. A computer subsystem, comprising:
    a circuit card; and
    a distribution card attachable to and for electrically coupling with, said circuit card, and being connectable to a backplane of a mid-range computer,
    wherein said circuit card receives power from the mid-range computer through said distribution card.

2. The computer subsystem defined in claim 1, wherein said circuit card comprises a primary logic card of a personal computer, having a processor module attached thereto.

3. The computer subsystem defined in claim 2, further comprising at least one additional circuit card attached to said primary logic card.

4. The computer subsystem defined in claim 2, wherein said primary logic card includes at least one connector disposed on a surface thereof for receiving an additional circuit card.

5. The computer subsystem defined in claim 4, wherein said at least one connector comprises a plurality of connectors, each for receiving a respective additional circuit card, with at least one of the additional circuit cards comprising a memory riser card, and at least another one of the additional circuit cards comprising a peripheral component interconnect riser card.

6. The computer subsystem defined in claim 5, wherein the memory riser card is adapted to accommodate a plurality of memory modules.

7. The computer subsystem defined in claim 5, wherein the peripheral component interconnect riser card is adapted to accommodate a plurality of input/output cards.

8. The computer subsystem defined in claim 5, further comprising a stiffener panel connected to said primary logic card and positioned to support the peripheral component interconnect riser card.

9. The computer subsystem defined in claim 2, further comprising a flexible printed circuit having one end connected to said distribution card, and another end connected to said primary logic card, to allow the transmission of data between said primary logic card and the mid-range computer through said distribution card.

10. The computer subsystem defined in claim 9, wherein said distribution card has at least one connector locatable in registration with, and engageable with, a corresponding backplane slot connector of the mid-range computer, said one end of said flexible printed circuit being directly electrically connected with said at least one connector.

11. The computer subsystem defined in claim 1, wherein said distribution card has a power regulator disposed thereon for regulating the power supplied therethrough to said circuit card.

12. The computer subsystem defined in claim 11, wherein said distribution card has a plurality of connectors, each having at least one terminal electrically coupled to said power regulator for electrically coupling said power regulator to said backplane, said distribution card being positionable to extend across a plurality of slots of the mid-range computer, so that each connector is in registration with, and engageable with, a corresponding backplane connector disposed at an end of a respective slot.

13. The computer subsystem defined in claim 12, wherein each of said at least one terminals is engageable with a respective power terminal of the mid-range computer, so that said power regulator receives power from the mid-range computer via each of said connectors of said distribution card.

14. A method of interfacing a computer subsystem with a mid-range computer, which comprises utilizing the computer subsystem of claim 1.

15. An enclosure, comprising:
a plurality of walls interconnected to form a first housing having a space therein for receiving computer components, said first housing being positionable to occupy a plurality of slots located in a second housing, said first housing having a width corresponding essentially to a total width of the plurality of slots, wherein said plurality of walls includes two oppositely disposed, parallel rails which are engageable with corresponding guides located in the second housing, said rails cooperating with the guides to position and guide said first housing in the plurality of slots.

16. The enclosure defined in claim 15, wherein said rails are perforated to allow a cooling gas to pass through the space.

17. The enclosure defined in claim 15, wherein said plurality of walls further includes at least two oppositely disposed, parallel covers arranged perpendicular to, and extending between, said rails, with said rails being pivotally connected to said covers, to allow access to the space.

18. The enclosure defined in claim 15, wherein each of said rails has a latch that engages with the second housing when said first housing is positioned within the plurality of slots.

19. A method of locating a personal computer subsystem within a mid-range computer, which comprises utilizing the enclosure of claim 15.

20. An enclosure, comprising:
a plurality of walls interconnected to form a first housing having a space therein for receiving computer components, said first housing being positionable to occupy a plurality of slots located in a second housing, said first housing having a width corresponding essentially to a total width of the plurality of slots,
wherein said plurality of walls includes a metal tailstock having at least one aperture formed therein, to allow for an electrical connection between a component locatable within the space, and a further component located external to the space.

21. An interface, comprising:
an enclosure comprised of a plurality of interconnected walls surrounding a space, said enclosure being positionable to occupy a plurality of slots located in a computer housing of a first type computer, said enclosure having a width corresponding essentially to a total width of the plurality of slots; and
a subsystem of a second type computer disposed within the space of said enclosure, and including:
a circuit card; and
a distribution card attachable to and for electrically coupling with, said circuit card, and being connectable to a backplane of the first type computer located external to said enclosure and within the computer housing.

22. The interface defined in claim 21, wherein the first type computer comprises a mid-range computer, and the second type computer comprises a personal computer, said subsystem being operatable using power supplied by the mid-range computer through said distribution board; said subsystem further comprising a power regulator disposed on said distribution card for regulating the power supplied therethrough to said circuit board.

23. The interface defined in claim 22, wherein said distribution card has a plurality of connectors electrically coupled to said power regulator, said distribution card being positionable to extend across the plurality of slots of the mid-range computer, so that each connector is in registration with, and engageable with, a corresponding backplane connector of the mid-range computer.

24. The interface defined in claim 21, wherein said circuit card includes at least one connector disposed on a surface thereof for receiving an additional circuit card.

25. The interface defined in claim 24, further comprising means for stabilizing the additional circuit card to prevent fretting of said at least one connector.

26. A method of interfacing a first type computer with a second type computer, which comprises utilizing the interface of claim 21.

27. A computer system, comprising:
a computer enclosure;
an electronics enclosure disposed within said computer enclosure, and being provided with a plurality of slots, each slot being adapted to accommodate an input/output circuit card;
a mid-range computer backplane disposed at one end of said electronics enclosure, and having a plurality of connectors disposed on a surface thereof, each connector being in registration with a respective slot;
a personal computer hardware enclosure having a space therein, and being positionable to occupy at least two of said plurality of slots; and
a personal computer subsystem disposed within the space of said personal computer hardware enclosure, and including:

a circuit card; and a distribution card attachable to, and for electrically coupling with, said circuit card and being electrically connectable to the backplane via at least two of said plurality of said connectors.

28. A distribution card attachable to, and for electrically coupling with, a circuit card, and being connectable to a backplane, comprising:

a plurality of first terminals, at least two of said first terminals being engageable with corresponding backplane terminals that each provides a discrete supply of power;

a plurality of second terminals, each second terminal being engageable with a corresponding circuit card terminal, with at least one of said circuit card terminals receiving a regulated supply of power from said distribution card through at least one of said second terminals; and a power regulator electrically coupled between said first and second terminals, and providing the regulated supply of power to the circuit card.

* * * * *